(12) United States Patent
Yoshikawa

(10) Patent No.: US 6,690,217 B2
(45) Date of Patent: Feb. 10, 2004

(54) DATA WIDTH CORRECTOR

(75) Inventor: Takefumi Yoshikawa, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/139,327

(22) Filed: May 7, 2002

(65) Prior Publication Data

US 2002/0172299 A1 Nov. 21, 2002

(30) Foreign Application Priority Data

May 21, 2001 (JP) ........................................ 2001-150373

(51) Int. Cl.[7] .............................................. H03K 3/017
(52) U.S. Cl. ........................................ 327/172; 327/175
(58) Field of Search ................. 327/172, 173, 327/174, 175

(56) References Cited

U.S. PATENT DOCUMENTS

| | | | | |
|---|---|---|---|---|
| 5,594,762 A | | 1/1997 | Joo et al. ................. 375/371 |
| 5,912,549 A | * | 6/1999 | Farrington et al. .......... 323/207 |
| 5,945,862 A | * | 8/1999 | Donnelly et al. ............ 327/278 |
| 6,038,255 A | * | 3/2000 | Palmer et al. ............... 375/238 |
| 6,169,434 B1 | * | 1/2001 | Portmann ..................... 327/175 |
| 6,426,886 B1 | * | 7/2002 | Goder ........................ 363/56.1 |

FOREIGN PATENT DOCUMENTS

JP         2000-183731        6/2000

* cited by examiner

Primary Examiner—Timothy P. Callahan
Assistant Examiner—Cassandra Cox
(74) Attorney, Agent, or Firm—McDermott, Will & Emery

(57) ABSTRACT

The data width corrector of the invention adjusts the data width appropriately even for data in which cross points have already deviated at the time of input. A data adjusting buffer changes a differential signal received from outside to single-phase receive data and outputs the receive data. A charge pump compares the average time of the HIGH period between the receive data and latch data latched with a latch clock having the same frequency, and supplies the results to the data adjusting buffer. The data adjusting buffer adjusts the duty of the receive data according to the received comparison results.

8 Claims, 11 Drawing Sheets

*PRIOR ART*

Duty 100%

Duty 80%

D=T*80%

Duty 120%

D=T*120%

Input data

*PRIOR ART*

DATA WIDTH CORRECTOR

BACKGROUND OF THE INVENTION

The present invention relates to a data width corrector for correcting the data width of receive data to obtain an appropriate data width when the data is input from outside.

FIG. 10 illustrates a conventional data width corrector (disclosed in Japanese Laid-Open Patent Publication No. 2000-183731). In this data width corrector, data width correction is performed by a duty compensation circuit 51, which includes a slice amplifier SAMP, average detectors AVD1 and AVD2, and a differential amplifier DAMP. The slice amplifier SAMP compares received differential data with a reference potential and outputs logical "0" and "1" sequentially. The average detectors AVD1 and AVD2 respectively calculate time averages of complementary signals output from the amplifier SAMP. The differential amplifier DAMP compares average signals from the average detectors AVD1 and AVD2 and changes the reference potential for the slice amplifier SAMP.

In a high-speed signal, in which the pulse rise and fall times are never negligible, a deviation of duty is expressed as a deviation of a cross point as shown in FIGS. 11A to 11C. The duty of such a signal can be 100% recovered by performing slice amplification focusing on the voltage at the cross point.

To state more specifically, in the duty compensation circuit 51, the average detectors AVD1 and AVD2 respectively calculate averages of the forward and reverse outputs of the slice amplifier SAMP, and the center voltage at a slice is feedback-controlled so that the averages match with each other. In this way, signals with 100% duty can be output from the two outputs of the slice amplifier SAMP. In other words, by calculating the difference between the averages of the forward and reverse outputs in the differential amplifier DAMP and setting the difference as a slice voltage for the slice amplifier SAMP, the duty of data signals output from the duty compensation circuit 51 can be made close to 100%.

However, the conventional data width corrector described above has the following problem. The duty compensation circuit 51 performs duty correction by setting the reference potential with respect to the cross point. Therefore, for data as shown in FIG. 12, for example, in which cross points have already deviated at the time of input, duty correction or correction for obtaining an appropriate data width is significantly difficult. In reality, the data width is widened or narrowed in some cases due to the properties of a transmitter driver, jitter on a transmission route, mismatch of an internal circuit of a receiver LSI and the like.

SUMMARY OF THE INVENTION

An object of the present invention is providing a data width corrector capable of adjusting the data width appropriately even for data in which cross points have already deviated at the time of input.

The data width corrector of the present invention includes: an input circuit for receiving a differential signal from outside, changing the differential signal to single-phase receive data, and outputting the receive data; a determination circuit for determining whether or not the HIGH period or the LOW period of the receive data is appropriate; and an adjustment circuit for adjusting duty of the receive data to make the HIGH period or the LOW period of the receive data appropriate based on the determination results from the determination circuit.

According to the invention described above, the determination circuit determines whether or not the HIGH period or the Low period of the receive data output from the input circuit is appropriate. The adjustment circuit adjusts the duty or the data width of the receive data to make the HIGH period or the LOW period appropriate. By this adjustment, the receive data becomes close to a desired data width, and this increases the margin used when the receive data is latched. In other words, the data width can be appropriately adjusted even for data in which cross points have already been deviated at the time of input.

Note that since data is not necessarily a repetition pattern of "0" and "1" as a clock is, the "duty " as used herein refers to a deviation of the width of "0" and "1" with respect to a desired data width.

Preferably, the determination circuit of the data width corrector described above compares the average time of the HIGH period or the LOW period between a reference signal input from outside and the receive data, and makes determination based on the comparison results.

With the above configuration, if noise is locally generated in the input data, it can be minimized by calculating time averages. Therefore, further appropriate determination is possible in the determination circuit.

Preferably, the reference signal is a clock signal having substantially the same frequency as the differential signal, and the determination circuit performs the determination within a predetermined period during which the differential signal is a clock signal pattern.

With the above configuration, the clock signal used for latching of the receive data can be used as the reference signal. Since an LSI for communication normally generates such a clock signal internally, no separate generation of the reference signal is required. Thus, this provides advantageous circuit configuration.

The reference signal is preferably a latch signal obtained by latching the receive data with a clock signal having substantially the same frequency as the differential signal.

With the above configuration, when the receive signal is latched with a clock signal having substantially the same frequency as the input differential signal, the data width of the resultant latch signal is restricted by the clock signal, providing a desired data width. Therefore, by using the latch signal as the reference signal, the data width of the receive data can be appropriately corrected. Moreover, this use of the latch signal eliminates the necessity of providing the predetermined period for input of a clock signal pattern, and thus data width correction is possible in real time.

Preferably, the data width corrector of the present invention further includes a frequency detector for detecting the difference in frequency between the differential signal and the clock signal, and the determination circuit halts the determination when the difference in frequency detected by the frequency detector exceeds a predetermined amount.

With the above configuration, adjustment of the data width is made when the frequency of the reference signal is sufficiently close to the frequency of the differential signal. Therefore, occurrence of an error in data width adjustment is prevented.

Preferably, the data width corrector of the present invention further includes a transition detector for detecting the number of times of transition of the receive data, and the determination circuit halts the determination when the number of times of transition detected by the transition detector exceeds a predetermined number.

With the above configuration, the data width adjustment is made only when the number of times of transition of the receive data is equal to or more than a predetermined number, that is, when comparison of the average time of the HIGH period or the LOW period is useful. Therefore, occurrence of an error in data width adjustment is prevented.

Preferably, the determination circuit of the data width corrector described above includes first and second comparison sections for determining which is greater in the average time of the HIGH period, the reference signal or the receive data and which is greater in the average time of the LOW period, the reference signal or the receive data, respectively, and the determination circuit halts the determination and holds the setting in the adjustment circuit when the determination results obtained by the first and second comparison sections match with each other.

With the above configuration, no data width correction of the receive data is performed when the determination results on the average times of the HIGH period and the LOW period match with each other because in this case it is regarded that the frequency of the reference signal is different from that of the receive data. Therefore, occurrence of an error in data width adjustment is prevented.

Preferably, the determination circuit of the data width corrector described above is configured to output the determination results in digital values.

DESCRIPTION OF THE PREFERRED EMBODIMENTS

Hereinafter, preferred embodiments of the present invention will be described with reference to the accompanying drawings.

Embodiment 1

Figure 1:
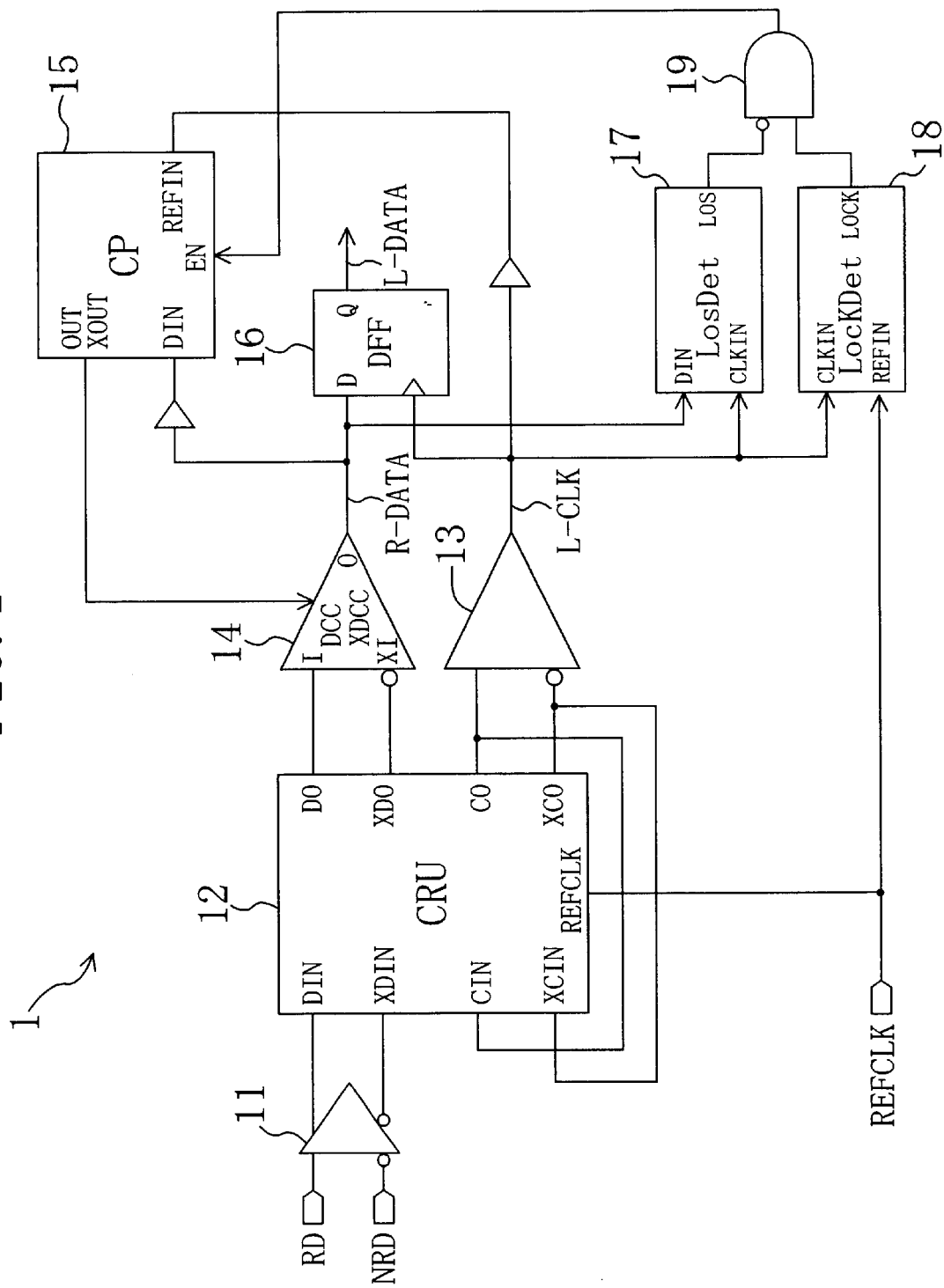
FIG. 1 is a block diagram of a data width corrector of Embodiment 1 of the present invention.

FIG. 1 illustrates a configuration of a data width corrector 1 of Embodiment 1 of the present invention. The data width corrector 1 includes a receiver 11, a clock recovery unit (CRU) 12, a clock buffer 13, a data adjusting buffer 14 and a charge pump 15. The receiver 11 receives input data RD/NRD from outside as a differential signal. The CRU 12 matches the frequency and phase of the data from the receiver 11 and those of an internal clock with each other. The clock buffer 13 receives a clock adjusted in frequency and phase from the CRU 12 and outputs a single-phase latch clock L-CLK for data latching. The data adjusting buffer 14, which has the same basic configuration as the clock buffer 13, outputs single-phase receive data R-DATA from the data from the CRU 12. The charge pump 15 receives the receive data R-DATA and the latch clock L-CLK as the reference signal, and compares the average time of the HIGH period between the two inputs. The receiver 11, the CRU 12 and the data adjusting buffer 14 constitute an input circuit.

The data width corrector 1 also includes a D-flipflop (DFF) 16, a transition detector 17 and a frequency detector 18. The DFF 16 receives the receive data R-DATA at a D input and the latch clock L-CLK at a clock input, and outputs latch data L-DATA. The operation of the transition detector 17 and the frequency detector 18 will be described later.

The CRU 12 has a voltage controlled oscillator (VCO) (not shown) internally for generation of a clock. The CRU 12 compares the clock generated by the VCO with the data from the receiver 11, and adjusts the timing of the clock by controlling the VCO so that the rising edges of the clock match with the edges of the data. The CRU 12 outputs the adjusted clock to the clock buffer 13, and also outputs the data from the receiver 11 to the data adjusting buffer 14 at a timing delayed by a half cycle of the clock.

The clock and the data output from the CRU 12, which are differential signals, are respectively changed to single-phase signals in the clock buffer 13 and the data adjusting buffer 14, to generate the receive data R-DATA and the latch clock L-CLK. The latch clock L-CLK is a clock signal having substantially the same frequency as the input data RD/NRD. The edges of the receive data R-DATA and the rising edges of the latch clock L-CLK are different in phase by 180°. Therefore, data latch is effected in the DFF 16, generating the latch data L-DATA.

The charge pump 15 receives the receive data R-DATA and the latch clock L-CLK and compares the HIGH period between the two inputs. Based on the comparison results, the charge pump 15 outputs an adjusting signal from nodes OUT/XOUT thereof for adjusting the duty ratio of the receive data R-DATA. The adjusting signal is supplied to adjusting nodes DCC/XDCC of the data adjusting buffer 14. In other words, the charge pump 15 as the determination circuit determines whether or not the HIGH period of the receive data R-DATA is appropriate, and the data adjusting buffer 14 as the adjustment circuit adjusts the duty of the receive data R-DATA to make the HIGH period thereof appropriate.

Figure 2B:
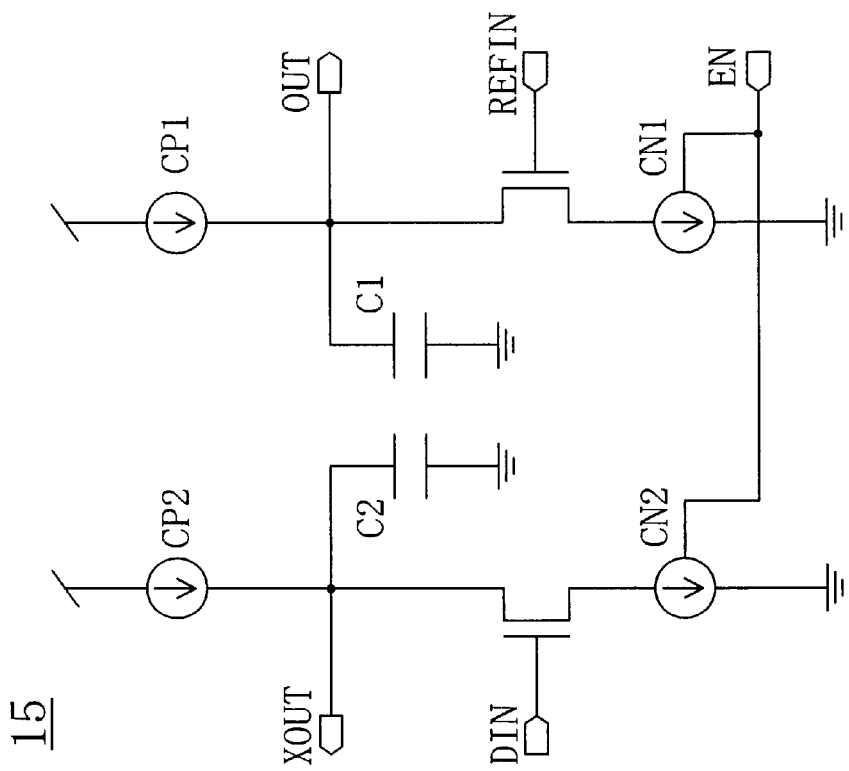
FIGS. 2A and 2B are circuit diagrams of a data adjusting buffer and a charge pump, respectively, of the data width corrector of FIG. 1.
Figure 2A:
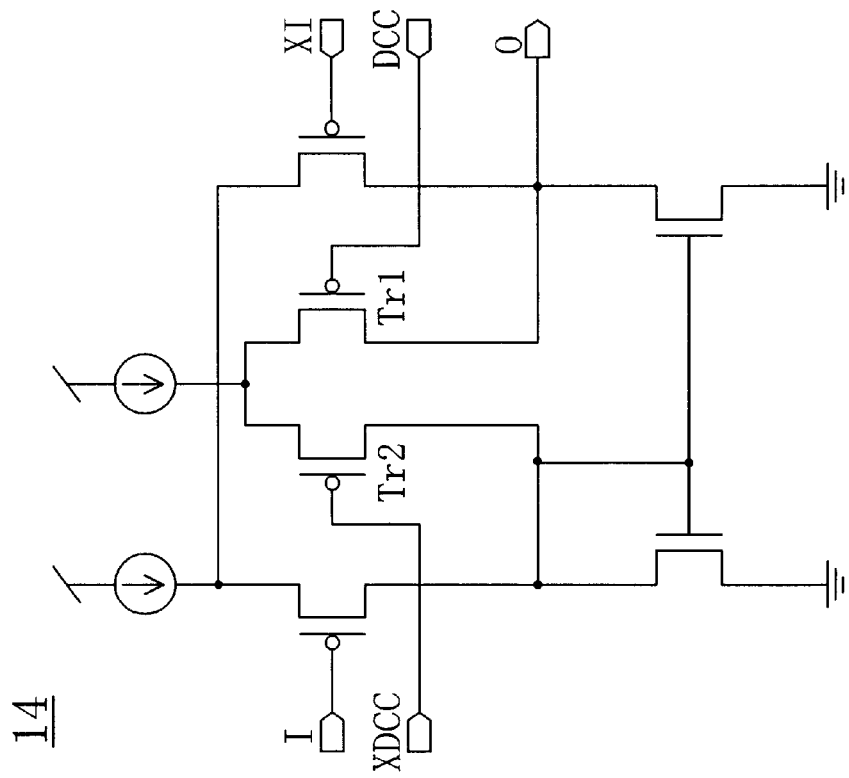

FIGS. 2A and 2B show exemplary circuit configurations of the data adjusting buffer 14 and the charge pump 15, respectively. As shown in FIG. 2A, the data adjusting buffer 14 includes the adjusting nodes DCC/XDCC for adjusting the duty of the receive data R-DATA to be output, in addition to nodes I/XI for receiving the data output from the CRU 12 and a node O for outputting the receive data R-DATA. The adjusting nodes DCC/XDCC are connected to the gates of transistors Tr1 and Tr2, respectively.

As shown in FIG. 2B, the charge pump 15 includes: original current sources CP1 and CP2 providing an equal current amount; sync current sources CN1 and CN2 providing an equal current amount; and capacitors C1 and C2 connected to the output nodes OUT/XOUT. Charges are drawn from the capacitors C1 and C2 during the HIGH periods of the latch clock L-CLK and the receive data R-DATA received at nodes REFIN and DIN, respectively, whereby the average times of the HIGH periods of the latch clock L-CLK and the receive data R-DATA are respectively output as the voltage levels at the output nodes OUT/XOUT.

Figure 3:
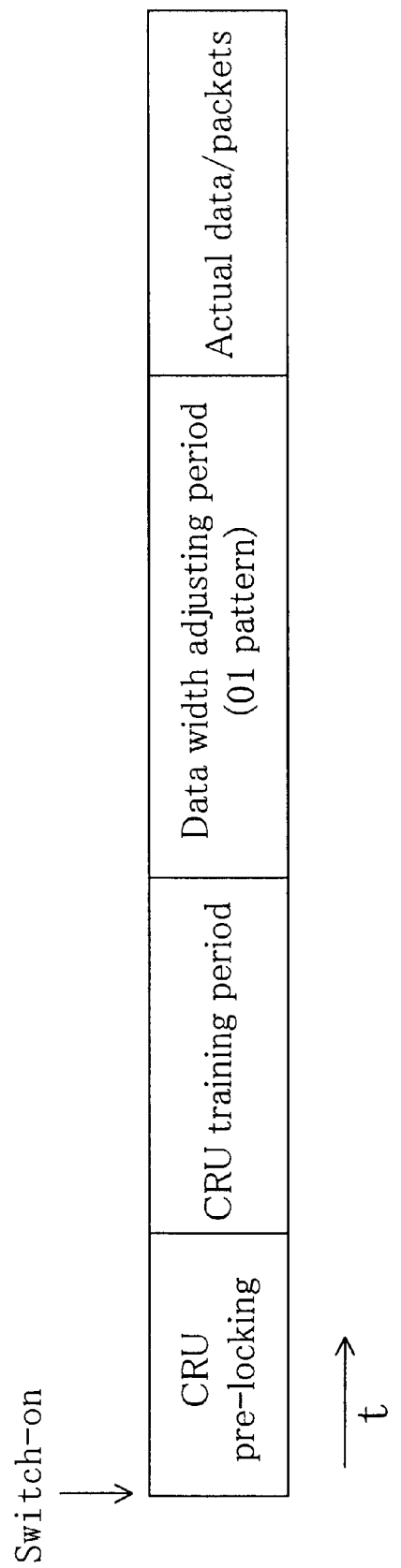
FIG. 3 is a conceptual illustration of the operation of the data width corrector of FIG. 1 with the lapse of time.

FIG. 3 conceptually illustrates the operation of the data width corrector of this embodiment with the lapse of time. The correction of the data width of the receive data R-DATA in this embodiment will be described with reference to FIG. 3.

Referring to FIG. 3, first, pre-locking of the CRU 12 is started upon switching on of the corrector. The pre-locking includes setting the oscillating frequency of the VCO of the CRU 12 at the frequency of the input data RD/NRD. More specifically, assuming that the rate of the input data is 1 Gbps, for example, the time at which the clock output of a CPU becomes 1 GHz±0.5%, for example, is detected by referring to the reference clock. A lock detector is provided to detect the clock output of 1 GHz±0.5%, for example, and this detection is used as a trigger for shift to the next period.

The next period is a training period of the CRU 12. The clock frequency set at the pre-locking has a difference in the range of several hundred ppm to 1% from the frequency of the input data. Therefore, during the training period, the edge of the input data and the rising edge of the clock are compared with each other, and the oscillating frequency of the VCO is adjusted to completely match with the frequency of the input data RD/NRD. That is, during the training period, the frequency and phase of the input data is made substantially identical to those of the clock. This adjustment is normally completed within 1 ms. Therefore, the duration of the training period is preset at 1 ms with an internal timer or the like, so that a trigger signal is generated for shift to the next period. During the training period, whether or not a predetermined training pattern is being received correctly is constantly monitored.

The next period is a data width adjusting period. During the data width adjusting period, it is previously agreed that a clock signal pattern of "0" and "1" is received from a sender as the input data RD/NRD. Therefore, during the data width adjusting period, both the receive data R-DATA and the latch clock L-CLK are the clock signal pattern of "0" and "1". The charge pump 15 outputs the terminal voltages at the capacitors C1 and C2 at the output nodes OUT/XOUT as the respective average times of the HIGH periods of the latch clock L-CLK and the receive data R-DATA. The voltage levels at the output nodes OUT/XOUT of the charge pump 15 are respectively supplied to the adjusting terminals DCC/XDCC of the data adjusting buffer 14.

When the HIGH period of the receive data R-DATA is longer than that of the latch clock L-CLK, that is, when the voltage level at the node OUT is higher than the voltage level at the node XOUT, the transistor Tr2 is turned on more intensely than the transistor Tr1 in the data adjusting buffer 14. This makes the falling edge of the receive data R-DATA earlier, and thus makes the HIGH period of the receive data R-DATA shorter. When the HIGH period of the receive data R-DATA is shorter than that of the latch clock L-CLK, that is, when the voltage level at the node OUT is lower than the voltage level at the node XOUT, the transistor Tr1 is turned on more intensely than the transistor Tr2 in the data adjusting buffer 14. This makes the rising edge of the receive data R-DATA earlier, and thus makes the HIGH period of the receive data R-DATA longer.

In short, feedback is performed so that the HIGH periods of the latch clock L-CLK and the receive data R-DATA are equal to each other. Therefore, when the duty ratio of the latch clock L-CLCK is acceptable, the data width of the receive data R-DATA becomes uniform both in the HIGH and LOW periods, exhibiting an idealistic form.

Thereafter, actual data/packets are received. The shift to the reception of actual data/packets is made with a lapse of a predetermined time (ms) set with a timer inside the LSI.

Thus, according to the present invention, whether or not the HIGH period of receive data is appropriate is determined, and based on the determination results, the duty of the receive data is adjusted. Therefore, the data width of the receive data can be appropriately adjusted even when cross points are deviated in input data. Whether or not the HIGH period of the receive data is appropriate is determined by comparing the average time of the HIGH period of the receive data with that of the latch clock. Therefore, if noise is locally generated in the input data, it can be minimized by calculating time averages. Thus, further appropriate determination is possible. Moreover, in an LSI for communication in which the data width corrector of this embodiment is mounted, generation of the latch clock is normally required. Therefore, there is no need to take the trouble of generating the latch clock only for use in determining whether or not the HIGH period of the receive data is appropriate.

In this embodiment, whether or not the HIGH period of the receive data is appropriate is determined. Alternatively, whether or not the LOW period of the receive data is appropriate may be determined by comparing the average time of the LOW period between the receive data and the latch clock. Otherwise, both the HIGH period and the LOW period may be used for the determination.

The data width corrector 1 of this embodiment includes the transition detector 17 for detecting the number of times of transition of the receive data R-DATA. Assume herein that the transition detector 17 detects whether or not the receive data R-DATA has made transition 32 times or more in 128 cycles. As an output LOS, "0" is output when the number of times of transition is 32 or more, or "1" is output when it is less than 32.

The data width corrector 1 of this embodiment further includes the frequency detector 18 for detecting the difference in frequency between the input data RD/NRD and the latch clock L-CLK. Assume herein that the frequency detector 18 detects whether or not the difference between the frequency of the latch clock L-CLK and a desired frequency is 1% or less by referring to the reference clock REFCLK. As an output LOCK, "1" is output when the frequency difference is 1% or less, or "0" is output when it exceeds 1%.

A logic gate 19 receives a reverse signal of the output LOS from the transition detector 17 and the output LOCK from the frequency detector 18, and outputs a signal for controlling the operation of the sync current sources CN1 and CN2 of the charge pump 15. To state more specifically, when the number of times of transition is 32 or more in 128 cycles and the frequency difference is 1% or less, the sync current sources CN1 and CN2 are turned on, to enable comparison of the HIGH period between the receive data R-DATA and the latch clock L-CLK. Otherwise, the sync current sources CN1 and CN2 are turned off, halting the comparison in the charge pump 15.

Embodiment 2

Figure 4:
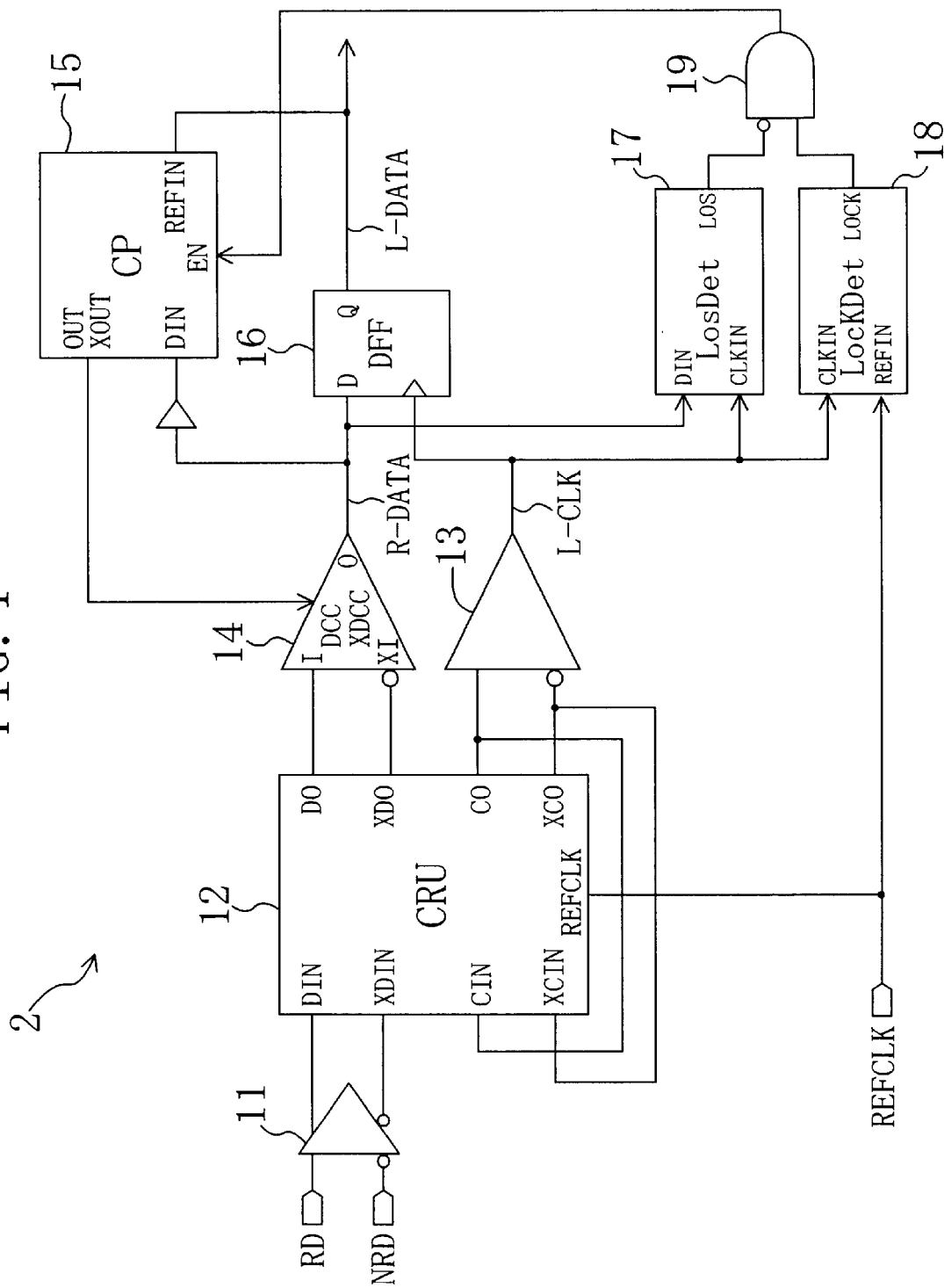
FIG. 4 is a block diagram of a data width corrector of Embodiment 2 of the present invention.

FIG. 4 illustrates a configuration of a data width corrector 2 of Embodiment 2 of the present invention. The configuration of FIG. 4 is the same as that of FIG. 1 except for the following point. The same components as those in FIG. 1 are denoted by the same reference numerals, and the description thereof is omitted here.

The data width corrector 2 of FIG. 4 is different from the data width corrector 1 of FIG. 1 in that the charge pump 15 receives the latch data L-DATA as the reference signal in place of the latch clock L-CLK. That is, in this embodiment, the charge pump 15 compares the average time of the HIGH period between the receive data R-DATA and the latch data L-DATA as the latch signal, to determine whether or not the HIGH period of the receive data R-DATA is appropriate.

Figure 5:
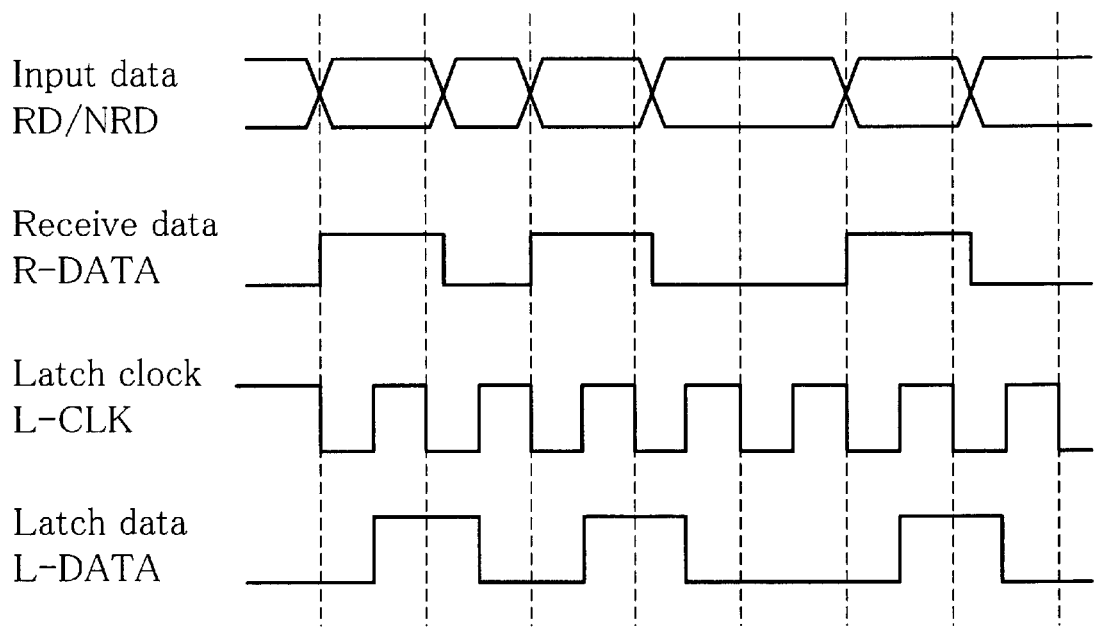
FIG. 5 is a timing chart showing changes of signals used in Embodiment 2 with time.

FIG. 5 is a timing chart showing changes of the signals used in this embodiment with time. As shown in FIG. 5, in the CRU 12, the rising edges of the latch clock L-CLK are made to match with the average center points of the input data RD/NRD, and the frequency of the latch clock L-CLK is made equal to that of the receive data R-DATA. By this processing, the latch data L-DATA has a signal waveform close to an idealistic form in which the HIGH/LOW widths are the same.

By adopting the above configuration, it is possible to determine whether or not the HIGH period of the receive data R-DATA is appropriate at any time by comparing the average time of the HIGH period between the receive data R-DATA and the latch data L-DATA. In other words, real time correction of the data width is possible without the necessity of particularly setting the data width adjusting period during which a clock signal pattern is transmitted as the input data RD/NRD.

Embodiment 3

Figure 6:
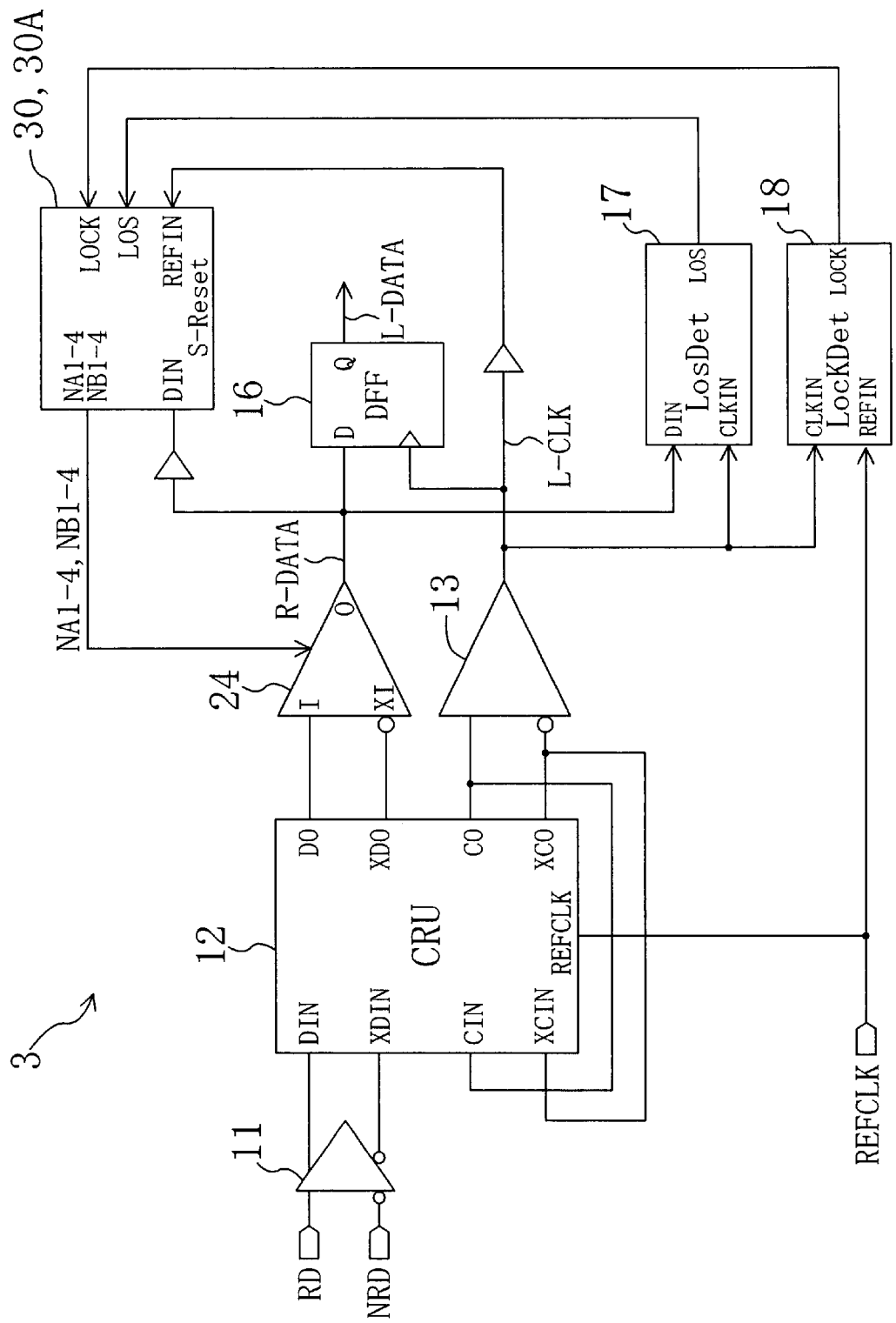
FIG. 6 is a block diagram of a data width corrector of Embodiment 3 of the present invention.

FIG. 6 illustrates a configuration of a data width corrector 3 of Embodiment 3 of the present invention. In FIG. 6, the same components as those in FIG. 1 are denoted by the same reference numerals, and the description thereof is omitted here. The data width corrector 3 of FIG. 6 is different from the data width corrector 1 of FIG. 1 in the following points. A controller 30 is provided in place of the charge pump 15, to compare the HIGH period between the receive data R-DATA and the latch clock L-CLK and output a signal for adjusting the duty of the receive data R-DATA as digital values NA1 to NA4 and NB1 to NB4. Also, a data adjusting buffer 24 is provided in place of the data adjusting buffer 14, to adjust the duty of the receive data R-DATA with the two sets of 4-bit data. In other words, in the data adjusting buffer 24, the data width of the receive data R-DATA is controlled with the digital values from the controller 30.

Figure 7:
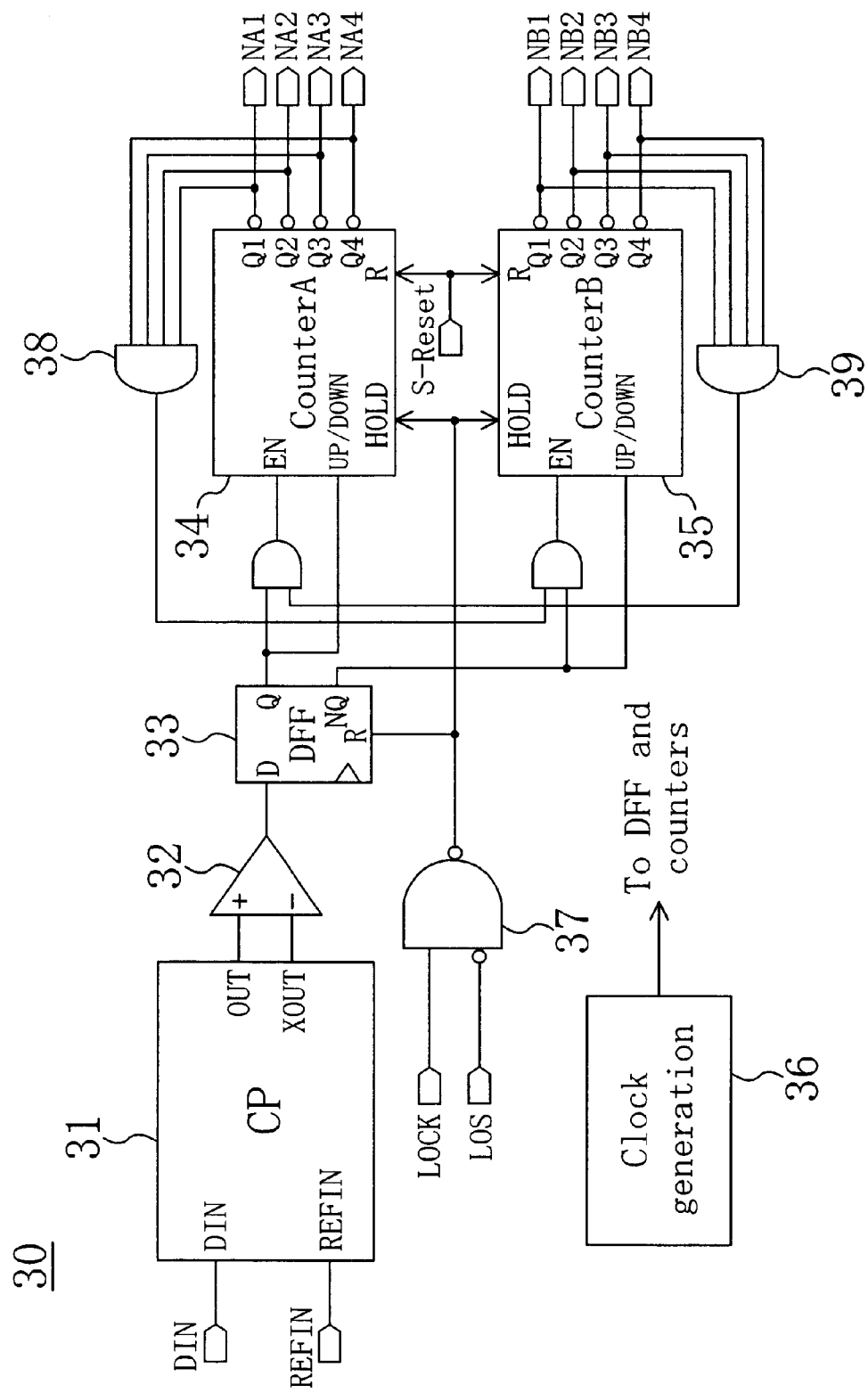
FIG. 7 is a block diagram of a controller of the data width corrector of FIG. 6.
Figure 8:
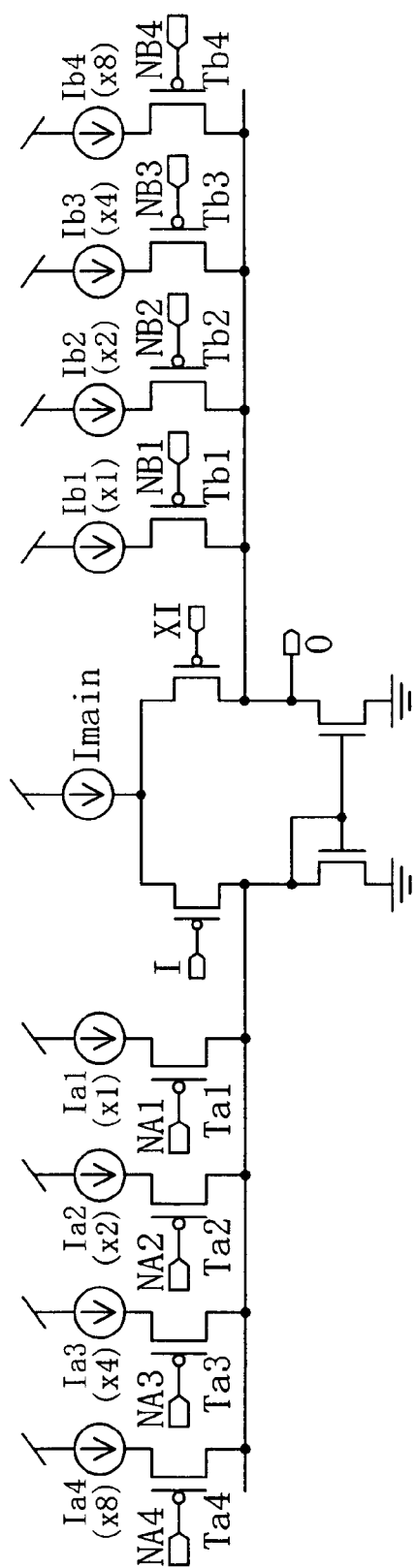
FIG. 8 is a circuit diagram of a data adjusting buffer of the data width corrector of FIG. 6.

FIGS. 7 and 8 illustrate configurations of the controller 30 and the data adjusting buffer 24, respectively, of the data width corrector of FIG. 6.

In the controller 30 of FIG. 7, a charge pump 31, as the charge pump 15 shown in FIG. 1, compares the average time of the HIGH period between the receive data R-DATA received at a node DIN and the latch clock L-CLK received at a node REFIN and outputs the comparison results as voltage levels at output nodes OUT/XOUT. An operational amplifier 32 receives the voltages at the output nodes OUT/XOUT of the charge pump 31, and outputs "1" when the voltage level at the output node OUT is higher and "0" when the voltage level at the output node XOUT is higher. A D-flipflop 33 latches the output of the operational amplifier 32 according to a clock having a comparatively low frequency generated by a clock generator 36.

First and second binary counters 34 and 35 count the clock generated by the clock generator 36. The first binary counter 34 increments when a Q output of the D-flipflop 33 is "1" and decrements when it is "0". The second binary counter 35 increments when an NQ output of the D-flipflop 33 is "1" (when the Q output is "0") and decrements when the NQ output is "0" (when the Q output is "1").

Outputs Q1 to Q4 of the first binary counter 34 as the digital values NA1 to NA4, and outputs Q1 to Q4 of the second binary counter 35 as the digital values NB1 to NB4 are respectively sent to the data adjusting buffer 24.

Referring to FIG. 8, in the data adjusting buffer 24, the digital values NA1 to NA4 are input into the gates of transistors Ta1 to Ta4, respectively, and the digital values NB1 to NB4 are input into the gates of transistors Tb1 to Tb4, respectively. The transistors Ta1 to Ta4 are respectively connected in series with current sources Ia1 to Ia4. The ratio of the current amounts supplied by the current sources Ia1 to Ia4 is 1:2:4:8. Likewise, the transistors Tb1 to Tb4 are respectively connected in series with current sources Ib1 to Ib4. The ratio of the current amounts supplied by the current sources Ib1 to Ib4 is 1:2:4:8. With this configuration, the duty of the receive data R-DATA to be output from an output node O can be controlled with the digital values NA1 to NA4 and NB1 to NB4.

The first and second binary counters 34 and 35 are arranged so that only one of them operates at one time by the action of 4-input AND gates 38 and 39. Only the binary counter in operation increments or decrements the clock. This arrangement is made to prevent the transistors Ta1 to Ta4 on the NA side and the transistors Tb1 to Tb4 on the NB side from being turned on simultaneously in the data adjusting buffers 24.

The operating frequency of the clock generator 36 must be properly set in consideration of the capacitance of capacitors of the charge pump 31 and the bandwidth of a feedback loop.

Figure 9:
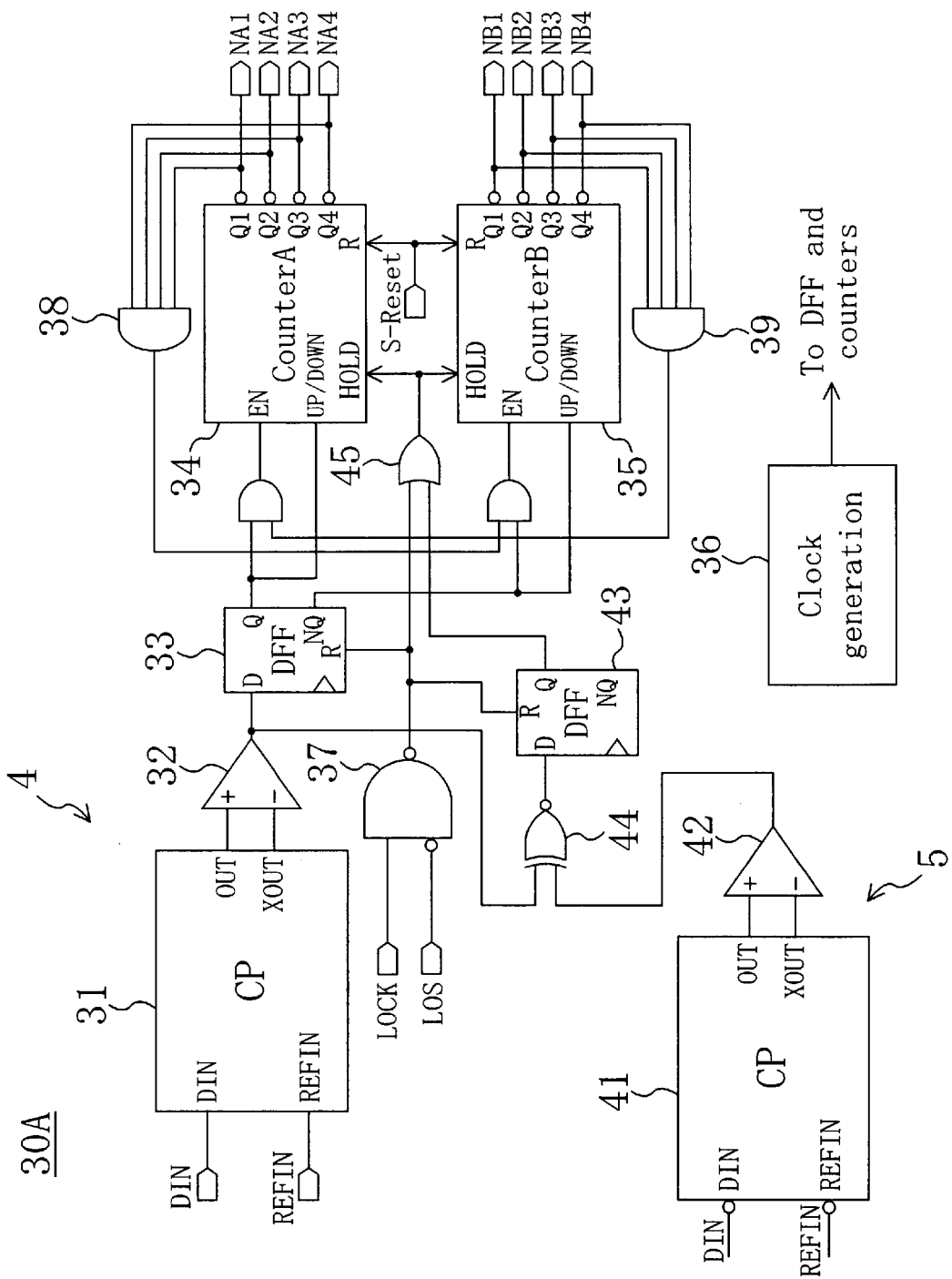
FIG. 9 is a block diagram of an alternative controller of the data width corrector of FIG. 6.
Figure 10:
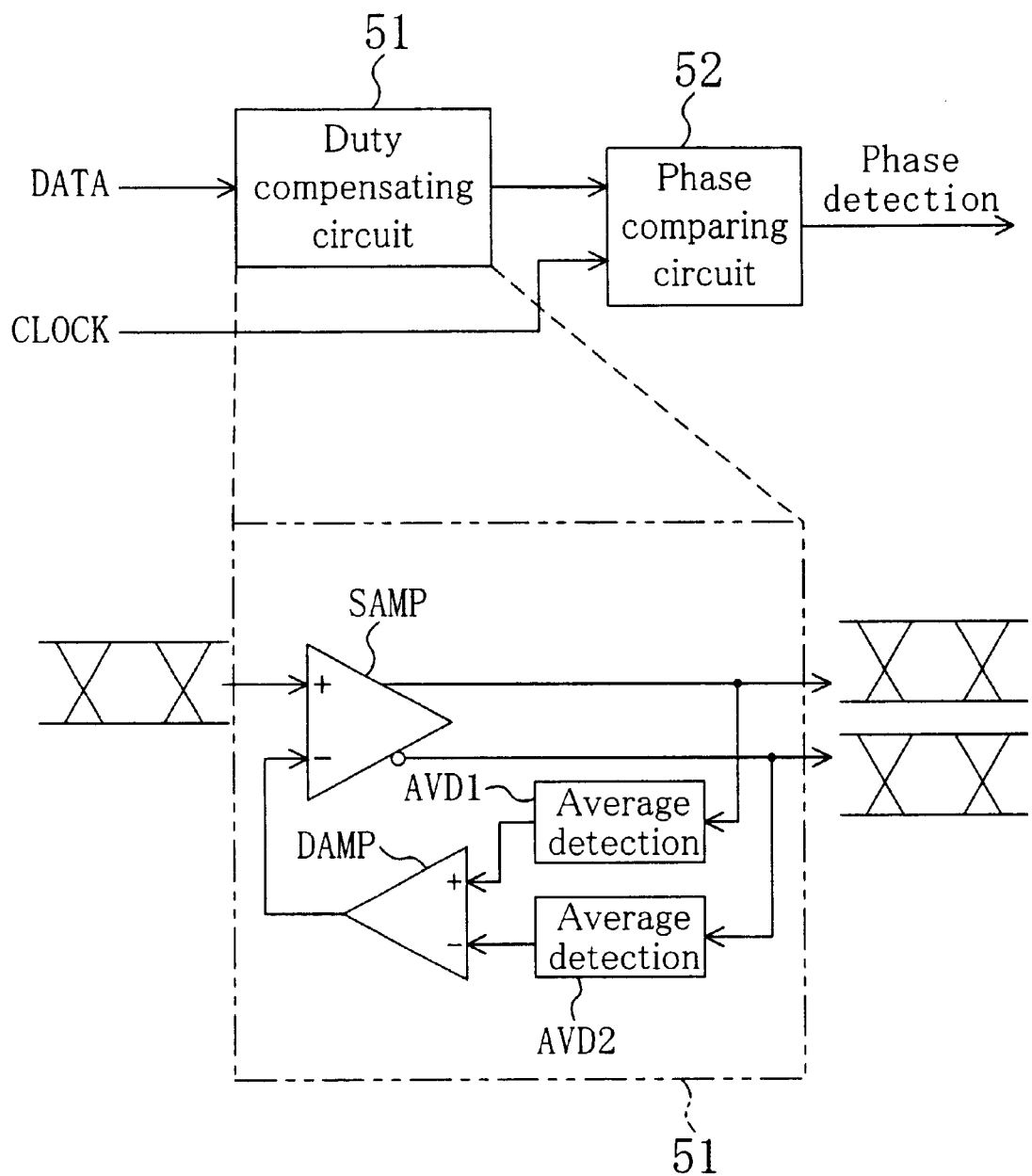
FIG. 10 is a block diagram of a conventional data width corrector.
Figure 11A:
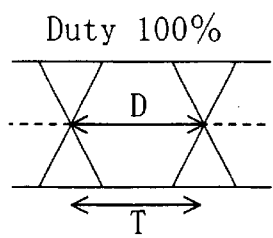
FIGS. 11A to 11C are illustrations of duty deviations.
Figure 11B:
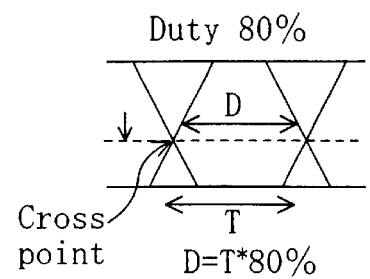
Figure 11C:
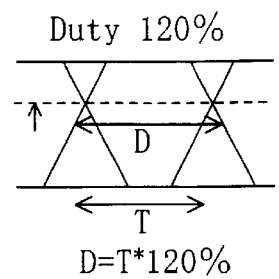
Figure 12:
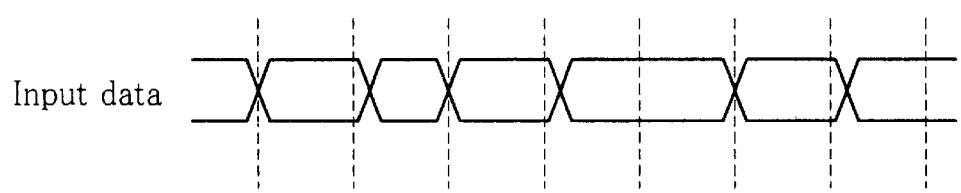
FIG. 12 is a timing chart of an example of input data in which cross points have deviated.

FIG. 9 illustrates a configuration of an alternative controller 30A of the data width corrector of FIG. 6. The controller 30A of FIG. 9 includes a second charge pump 41 for comparing the average time of the LOW period between the receive data R-DATA and the latch clock L-CLK, in addition to the first charge pump 31. The second charge pump 41 receives a reverse signal of the receive data R-DATA at a node DIN and a reverse signal of the latch clock L-CLK at a node REFIN. An operational amplifier 42 receives voltages at output nodes OUT/XOUT of the charge pump 41, and outputs "1" when the voltage level at the output node OUT is higher and "0" when the voltage level at the output node XOUT is higher.

The first charge pump 31 and the operational amplifier 32 constitute a first comparison section 4, and the second charge pump 41 and the operational amplifier 42 constitute a second comparison section 5. Thus, the first and second comparison sections 3 and 4 determine the greater ones of the average times of the HIGH period and the LOW period, respectively, between the receive data R-DATA and the latch clock L-CLK as the reference signal.

The outputs of the operational amplifiers 32 and 42 are input into an EXNOR gate 44, the output of which is then supplied to a D input of a D-flipflop 43. A Q output of the D-flipflop 43 is supplied to the first and second binary counter 34 and 35 via an OR gate 45 as a HOLD signal. With this configuration, when the greater ones determined by the first and second comparison sections 4 and 5 match with each other, that is, when the receive data R-DATA is longer or shorter than the latch clock L-CLK both in the HIGH and LOW periods, the first and second binary counters 34 and 35 are put in a hold state, halting the determination.

The state that the receive data R-DATA is longer or shorter than the latch clock L-CLK both in the HIGH and LOW periods means that the frequency of the input data is different from that of the clock. In this case, no data width (duty) correction is required. Therefore, preferably, the operation of the binary counters 34 and 35 is halted so that no data width adjustment is performed.

The above phenomenon may occur when the data width is gradually widened or narrowed as a whole due to low-frequency jitter on a transmission route such as a cable and an optical fiber, for example. In such a case, the CRU 12 adjusts the frequency of the clock so as to match with that of the input data of which the width is being widened or narrowed. During this frequency adjustment, it is not preferable to perform the data width correction because this changes the edges of the data. This is the reason why the binary counters 34 and 35 are put in a hold state halting the determination.

In this embodiment, the latch clock L-CLK was used as the reference signal for the determination. Alternatively, as in Embodiment 2, the latch data L-DATA may be used as the reference signal.

Thus, according to the present invention, the data width of receive data can be corrected to be close to an idealistic form even when cross points of input data are deviated. Therefore, the data width is widened to the theoretically maximum value when the receive data is latched. This improves jitter tolerance of the latch clock, and thus improves the tracking ability even when low-frequency jitter and the like exist on input data.

While the present invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

What is claimed is:

1. A data width corrector comprising:
   an input circuit for receiving a differential signal from outside, changing the differential signal to single-phase receive data, and outputting the receive data; and
   a determination circuit for determining whether or not the HIGH period or the LOW period of the receive data is appropriate;
   said input circuit including an adjustment circuit for adjusting duty of the receive data to make the HIGH period or the LOW period of the receive data appropriate based on the determination results from the determination circuit,
   wherein the determination circuit compares the average time of the HIGH period or the LOW period between a reference signal input from outside and the receive data, and determines based on the comparison results.

2. The data width corrector of claim 1, wherein the reference signal is a clock signal having substantially the same frequency as the differential signal, and
   the determination circuit performs the determination within a predetermined period during which the differential signal is a clock signal pattern.

3. The data width corrector of claim 2, further comprising a frequency detector for detecting the difference in frequency between the differential signal and the clock signal, and
   the determination circuit halts the determination when the difference in frequency detected by the frequency detector exceeds a predetermined amount.

4. The data width corrector of claim 1, wherein the reference signal is a latch signal obtained by latching the receive data with a clock signal having substantially the same frequency as the differential signal.

5. The data width corrector of claim 4, further comprising a frequency detector for detecting the difference in frequency between the differential signal and the clock signal, and
   the determination circuit halts the determination when the difference in frequency detected by the frequency detector exceeds a predetermined amount.

6. The data width corrector of claim 1, further comprising a transition detector for detecting the number of times of transition of the receive data, and
   the determination circuit halts the determination when the number of times of transition detected by the transition detector is less than a predetermined number.

7. The data width corrector of claim 1, wherein the determination circuit includes first and second comparison sections for determining which is greater in the average time of the HIGH period, the reference signal or the receive data and which is greater in the average time of the LOW period, the reference signal or the receive data, respectively, and
   the determination circuit halts the determination and holds the setting in the adjustment circuit when the determination results obtained by the first and second comparison sections match with each other.

8. The data width corrector of claim 1, wherein the determination circuit is configured to output the determination results in digital values.

* * * * *